United States Patent
Shiotani

(12) 
(10) Patent No.: US 9,425,791 B2
(45) Date of Patent: Aug. 23, 2016

(54) SEMICONDUCTOR INTEGRATED CIRCUIT WITH SHUTOFF CONTROL FOR PLURAL POWER DOMAINS

(75) Inventor: Masayoshi Shiotani, Shiga (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 1303 days.

(21) Appl. No.: 13/305,775

(22) Filed: Nov. 29, 2011

(65) Prior Publication Data

US 2012/0068539 A1 Mar. 22, 2012

Related U.S. Application Data

(63) Continuation of application No. PCT/JP2010/003559, filed on May 27, 2010.

(30) Foreign Application Priority Data

Jun. 3, 2009 (JP) .................... 2009-134510

(51) Int. Cl.
*G06F 1/26* (2006.01)
*G06F 15/177* (2006.01)
(Continued)

(52) U.S. Cl.
CPC .............. *H03K 19/0016* (2013.01); *G06F 1/30* (2013.01); *G06F 1/16* (2013.01); *G06F 1/24* (2013.01); *G06F 1/263* (2013.01); *G06F 1/3234* (2013.01);
(Continued)

(58) Field of Classification Search
CPC ....... G06F 1/3234; G06F 1/3287; G06F 1/24; G06F 1/30; G06F 1/263; G06F 13/38; G06F 13/4068; G06F 1/16; G06F 1/3265

USPC .............. 713/1, 320, 324; 714/14; 326/51, 56
See application file for complete search history.

(56) References Cited

U.S. PATENT DOCUMENTS 5,664,089 A * 9/1997 Byers et al. ..................... 714/14
2004/0010726 A1 1/2004 Motegi et al.
(Continued)

FOREIGN PATENT DOCUMENTS

| JP | 2001-203324 | 7/2001 |
| JP | 2004-048370 | 2/2004 |
| JP | 2005-311622 | 11/2005 |

OTHER PUBLICATIONS

International Search Report and Written Opinion for PCT/JP2010/003559, dated Jun. 22, 2010, along with an English translation of ISR.

*Primary Examiner* — Ji H Bae
(74) *Attorney, Agent, or Firm* — McDermott Will & Emery LLP

(57) ABSTRACT

A constantly power-ON domain and a standby-time power OFF domain are included on the same chip, and the constantly power-ON domain includes: a shutoff control circuit shutting off a signal inputted and outputted between the constantly power-ON domain and the standby-time power OFF domain when the first power source is ON and the second power source is OFF; and a shutoff control circuit outputting a first control signal indicating that shutoff of an emergent shutoff control circuit unit is to be enabled or disabled, the standby-time power OFF domain includes the emergent shutoff control circuit unit shutting off, based on the first control signal from the shutoff control circuit, the signal inputted between the emergent shutoff control circuit unit and the constantly power-ON domain.

4 Claims, 7 Drawing Sheets

(51) Int. Cl.
*G06F 1/00* (2006.01)
*G06F 11/00* (2006.01)
*H03K 19/20* (2006.01)
*H03K 19/00* (2006.01)
*G06F 1/30* (2006.01)
*G06F 1/32* (2006.01)
*G06F 1/16* (2006.01)
*G06F 13/38* (2006.01)
*G06F 1/24* (2006.01)
*G06F 13/40* (2006.01)

(52) U.S. Cl.
CPC .......... *G06F 1/3265* (2013.01); *G06F 1/3287* (2013.01); *G06F 13/38* (2013.01); *G06F 13/4068* (2013.01); *Y10T 307/50* (2015.04)

(56) References Cited

U.S. PATENT DOCUMENTS

| | | | |
|---|---|---|---|
| 2005/0225355 A1* | 10/2005 | Kuang et al. | 326/81 |
| 2005/0232053 A1 | 10/2005 | Azuma et al. | |
| 2005/0253462 A1* | 11/2005 | Falkowski et al. | 307/43 |
| 2006/0064293 A1* | 3/2006 | Kapoor et al. | 703/18 |
| 2008/0067995 A1* | 3/2008 | Chua-Eoan | H02M 3/158 323/284 |
| 2009/0259864 A1* | 10/2009 | Li et al. | 713/323 |
| 2009/0267686 A1 | 10/2009 | Azuma et al. | |
| 2011/0068826 A1 | 3/2011 | Azuma et al. | |

* cited by examiner

SEMICONDUCTOR INTEGRATED CIRCUIT WITH SHUTOFF CONTROL FOR PLURAL POWER DOMAINS

CROSS-REFERENCE TO RELATED APPLICATIONS

This application is a continuation of International Application No. PCT/JP2010/003559, filed May 27, 2010, and claims the priority of Japanese Patent Application No. 2009-134510, filed on Jun. 3, 2009, the disclosures of which, including the specifications, drawings, and claims, are incorporated herein by reference in their entireties.

BACKGROUND OF THE INVENTION (1) Field of the Invention

The present invention relates to semiconductor integrated circuits, and more specifically to semiconductor integrated circuits including on the same chip a power-ON domain as a circuit region which receives power supply from a first power source and a power-OFF domain as a circuit region which receives power supply from a second power source independent from the first power source and to which the power supply from the second power source is stopped as a result of turning-off of the second power source by control of the power-ON domain.

(2) Description of the Related Art

Conventionally known is a semiconductor integrated circuit including on the same chip a power-ON domain as a circuit region where a power is constantly ON and a power-OFF domain as a circuit region where a power is turned off when necessary. In such a semiconductor integrated circuit, upon shutoff of the power of the power-OFF domain, an unstable signal in the shut power-OFF domain may be transmitted to the constantly power-ON domain in operation.

On the contrary, suggested in Patent Document Reference (Japanese Patent Application Laid-open No. 2005-311622) is a semiconductor integrated circuit that prevents an unstable signal when a power of a power-OFF domain is shut off from being transmitted to a constantly power-ON domain in operation.

FIGS. 7A and 7B are diagrams illustrating the semiconductor integrated circuit in Patent Document 1 described above. This semiconductor integrated circuit includes: a circuit block 2 and a circuit block 3 corresponding to the constantly power-ON domain (hereinafter described as constantly power-ON circuit blocks); and a circuit block 1 corresponding to the power-OFF domain (hereinafter described as power-OFF circuit block).

As shown in FIG. 7A, in a case where powers of both the constantly power-ON circuit block and the power-OFF circuit block are ON, that is, they are in operation, by a power control signal (SWC) from the circuit block 3, power supply to the circuit block 1 is performed. At this point, a signal from the circuit block 1 can be inputted to an input circuit composed of logic gate circuits including, for example, a latch circuit FF, a NAND circuit G1, and a NOR circuit included in the circuit block 2.

On the other hand, as shown in FIG. 7B, in a case where the power of the power-OFF circuit block is turned off, that is, the power-OFF circuit block is put into a non-operating state, by the power control signal (SWC) from the circuit block 3, the power supply of the circuit block 1 is shutoff, that is, power shutoff is performed. Then by an unstable signal preventing control signal (INC) from the circuit block 3, the signal from the circuit block 1 is prevented from being inputted to the input circuit included in the circuit block 2.

By performing the power shutoff control as described above, the semiconductor integrated circuit in Patent Document 1 described above prevents the unstable signal when the power of the power-OFF circuit block is shut off from being transmitted to the constantly power-ON circuit block in operation.

SUMMARY OF THE INVENTION

However, the conventional semiconductor integrated circuit does not consider a case where the power of the constantly power-ON circuit block is first shut off. For example, in a case where an unanticipated state in which an AC outlet supplying a power to the constantly power-ON circuit block has comes out occurs and under the influence of, for example, a capacitor connected to the power, the power of the constantly power-ON circuit block turns off earlier than a power of the power-OFF circuit block, power shutoff control provided to the constantly power-ON circuit block becomes uncontrollable. As a result, a high-level signal from the power-OFF circuit block at work is inputted to the constantly power-ON circuit block whose power has first turned off, for example, abnormal voltage is added to a gate of a MOSFET forming the power-ON circuit block and circuit characteristics change or the unstable signal of the constantly power-ON circuit block whose power has been shut off is transmitted to the power-OFF circuit block in operation, having adverse effect on the power-OFF circuit block. As described above, in the case where the power of the constantly power-ON circuit block has turned off earlier than that of the power-OFF circuit block, adverse effect is exerted on the semiconductor integrated circuit.

Examples of the adverse effect here are: 1) the abnormal voltage is added to the gate of the MOSFET forming the constantly power-ON circuit block whose power has been shut off and the circuit characteristics change, which results in failure to perform desired normal operation; 2) the unstable signal of the constantly power-ON circuit block whose power has been shut off is inputted to the power-OFF circuit block at work and through current flows to, for example, the MOSFET forming the power-OFF circuit block, and the circuit characteristics change, which results in failure to perform desired normal operation; and 3) for example, writing to an external nonvolatile memory such as an SD card controlled by a device including the semiconductor integrated circuit is not properly controlled, causing damage, which results in damage to data in the memory, leading to recovery failure; and 4) in a case where the semiconductor integrated circuit is included in, for example, a television, saving of viewed channel information and volume information, which is performed at time of power-off, cannot be performed.

The invention has been made to solve the problem described above, and it is an object of the invention to provide a semiconductor integrated circuit that prevents adverse effect from being exerted on a power-OFF circuit region even when a power of a constantly power-ON circuit region has been first shut off.

To achieve the object described above, a semiconductor integrated circuit according to one aspect of the invention includes on a same chip a power-ON domain as a circuit region which receives power supply from a first power source and a power-OFF domain as a circuit region which receives power supply from a second power source provided independently from the first power source and in which the second power source is turned off by control of the power-ON domain to thereby stop the power supply from the second power source. The power-ON domain includes: a first signal shutoff unit configured to shut off a signal inputted and outputted between the power-ON domain and the power-OFF domain when the first power source is ON and the second power source is OFF; and a shutoff control unit configured to output a first control signal indicating that shutoff by a second signal shutoff unit different from the first signal shutoff unit is to be enabled or disabled, wherein the power-OFF domain includes the second signal shutoff unit configured to shut off the signal inputted and outputted between the power-ON domain and the power-OFF domain based on the first control signal which indicates that shutoff is to be enabled and which is outputted from the shutoff control unit, and the shutoff control unit is configured to, upon detection of stop of the power supply from the first power source, output the first control signal indicating that the shutoff is to be enabled.

With this configuration, a semiconductor integrated circuit can be realized which prevents adverse effect from being exerted on the power-OFF circuit region even when the power of the constantly power-ON circuit region has been first shut off.

More specifically, there is a case where an unanticipated state occurs in which the AC outlet has come out and the first power source has been turned off, no power has been supplied to the power-ON domain whose power is always ON, and the power-ON domain has been turned off earlier than the power of the power-OFF domain. In this case, with this configuration, the shutoff control unit and the second signal shutoff unit can function to prevent inputting of an unstable signal from the power-ON domain to the power-OFF domain and inputting of through current to the power-ON domain.

Moreover, the second signal shutoff unit may include: a holding circuit configured to hold the first control signal outputted by the shutoff control unit and based on the held first control signal, output a second control signal indicating that the shutoff of the signal inputted and outputted between the power-ON domain and the power-OFF domain is to be enabled or disabled; and a signal shutoff circuit configured to shut off, in accordance with the second control signal outputted by the holding circuit, the signal inputted and outputted between the power-ON domain and the power-OFF domain.

Moreover, the shutoff control unit may turn the first control signal into a low level in order to indicate that the shutoff is to be enabled, and output the signal to the holding circuit, the holding circuit may hold the low-level first control signal outputted by the shutoff control unit and based on the held low-level first control signal, turn the second control signal into a low level in order to indicate that the shutoff of the signal inputted and outputted between the power-ON domain and the power-OFF domain is to be disabled, and output the signal to the signal shutoff circuit, and the signal shutoff circuit may, in accordance with the low-level second control signal outputted by the holding circuit, shut off the signal inputted and outputted between the power-ON domain and the power-OFF domain.

Moreover, said holding circuit may include a plurality of logic gate circuits including an AND circuit, a latch circuit, and an RS flip-flop, said AND circuit may, upon reception of the first control signal outputted by said shutoff control unit and a signal outputted by said RS flip-flop, output the signals to said latch circuit and said signal shutoff circuit, said latch circuit may, upon reception of the signals outputted by said AND circuit, output the signals to said RS flip-flop, said RS flip-flop may, upon reception of the signals outputted by said latch circuit, output the signals to said AND circuit, and said signal shutoff unit may, upon reception of the second control signal turned into a low level from said AND circuit in order to indicate that the shutoff is to be enabled, output the low-level signal.

The shutoff control unit may include a flip-flop, and the flip-flop may, upon detection of stop of the power supply from the first power source, turn the first control signal into a low level in order to indicate that the shutoff is to be enabled, and output the signal to the holding circuit.

Moreover, the shutoff control unit may, after start of the power supply from the first power source, further output to the holding circuit the first control signal indicating that the shutoff is to be disabled, when the holding circuit is configured to, upon reception of a reset signal, may release the holding of the second control signal indicating that the shutoff at the signal shutoff circuit is to be enabled, further hold the first control signal outputted by the shutoff control unit, and based on the held first control signal, output to the signal shutoff circuit the second control signal indicating that the shutoff of the signal inputted and outputted between the power-ON domain and the power-OFF domain is to be disabled, and the signal shutoff circuit may, in accordance with the second control signal outputted by the holding circuit, disable the shutoff of the signal inputted and outputted between the power-ON domain and the power-OFF domain.

The invention is not only realized as a device but may also be realized as an integrated circuit including a processing means included in such a device.

The invention can realize a semiconductor integrated circuit that prevents adverse effect from being exerted on a power-OFF circuit region even when a power of a constantly power-ON circuit region has been first shut off.

FURTHER INFORMATION ABOUT TECHNICAL BACKGROUND TO THIS APPLICATION

The disclosure of Japanese Patent Application No. 2009-134510 filed on Jun. 3, 2009 including specification, drawings and claims is incorporated herein by reference in its entirety.

The disclosure of PCT application No. PCT/JP2010/003559 filed on May 27, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENT

Hereinafter, an embodiment of the present invention will be described with reference to the accompanying drawings.

Figure 1:
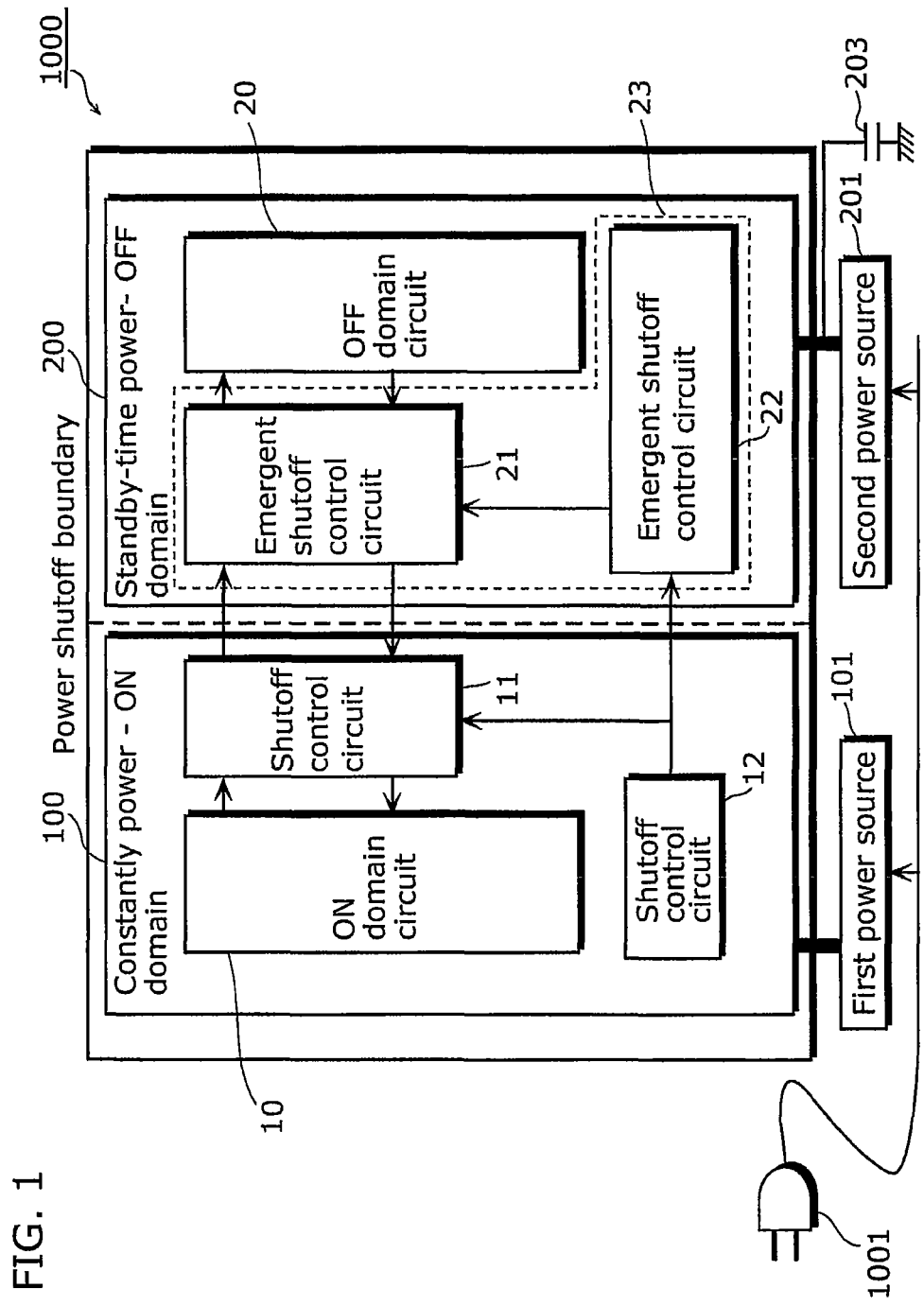
FIG. 1 is a block diagram showing schematic configuration of a semiconductor integrated circuit according to the invention.

FIG. 1 is a block diagram showing schematic configuration of a semiconductor integrated circuit according to the invention.

The semiconductor integrated circuit 1000 shown in FIG. 1 includes: a constantly power-ON domain 100, a standby-time power-OFF domain 200, a first power source 101, and a second power source 201, and for example, by an AC outlet 1001, powers are supplied to the first power source 101 and the second power source 201.

In the semiconductor integrated circuit 1000, the constantly power-ON domain 100 and the standby-time power-OFF domain 200 are formed on the same chip. To the constantly power-ON domain 100 and the standby-time power-OFF domain 200, the powers are supplied by the first power source 101 and the second power source 201, respectively.

The first power source 101 is a circuit performing control to always keep a supplied voltage constant, for example, a regulator. The first power source 101 is connected to the AC outlet 1001, and supplies a power to the constantly power-ON domain 100 independently from the second power source 201.

The constantly power-ON domain 100 corresponds to a power-ON domain according to the invention, is a region including a circuit where a power is assumed to be constantly supplied (hereinafter described as constantly power-ON), and is formed on the chip of the semiconductor integrated circuit 1000. Moreover, the constantly power-ON domain 100 is composed of: an ON domain circuit 10, a shutoff control circuit 11, and a shutoff control circuit 12.

The ON domain circuit 10 is a circuit that realizes main functions of the constantly power-ON domain 100 including, for example, control of activation or shutdown of the standby-time power-OFF domain 200.

The shutoff control circuit 11 corresponds to a first signal shutoff unit according to the invention, and shuts off a signal between the constantly power-ON domain 100 and the standby-time power-OFF domain 200 in accordance with a control signal from the shutoff control circuit 12.

More specifically, when the shutoff control circuit 11 has received from the shutoff control circuit 12 a shutoff control signal (SHUTC) indicating that shutoff is to be disabled, the shutoff control circuit 11 can receive the signal transmitted from the constantly power-ON domain 100 to the standby-time power-OFF domain 200 and output the received signal to the standby-time power-OFF domain 200. Moreover, at this point, the shutoff control circuit 11 can receive a signal transmitted from the standby-time power-OFF domain 200 to the constantly power-ON domain 100 and output the received signal to the ON domain circuit 10.

On the contrary, when the shutoff control circuit 11 has received a shutoff control signal (SHUTC) indicating that the shutoff is to be enabled, the shutoff control circuit 11 shuts off signal input from the ON domain circuit 10 and the standby-time power-OFF domain 200 and at the same time, also shuts off signal output to the ON domain circuit 10 and the standby-time power-OFF domain 200.

The shutoff control circuit 12 corresponds to a shutoff control unit according to the invention, and outputs a shutoff control signal (SHUTC) to the shutoff control circuit 11 and the standby-time power-OFF domain 200 (emergent shutoff control circuit 22). Then the shutoff control circuit 12 can output the shutoff control signal (SHUTC) to thereby prohibit or permit signal inputting or signal outputting by the shutoff control circuit 11. Note that a value of the shutoff control signal (SHUTC) outputted by the shutoff control circuit 12, that is, a value indicating that the shutoff is to be enabled or disabled can be changed by the ON domain circuit 10 when the constantly power-ON domain 100 is at work.

More specifically, the shutoff control circuit 12, upon outputting to the shutoff control circuit 11 the shutoff control signal (SHUTC) indicating that the shutoff is to be enabled, makes the shutoff control circuit 11 shut off the signal between the constantly power-ON domain 100 and the standby-time power-OFF domain 200. On the contrary, the shutoff control circuit 12, upon outputting to the shutoff control circuit 11 the shutoff control signal (SHUTC) indicating that the shutoff is to be disabled, makes the shutoff control circuit 11 release the shutoff of the signal between the constantly power-ON domain 100 and the standby-time power-OFF domain 200.

For example, when a reset signal indicating power-OFF has been inputted to the constantly power-ON domain 100, the shutoff control circuit 12 outputs to the shutoff control circuit 11 the shutoff control signal (SHUTC) indicating that the shutoff is to be enabled. Moreover, for example, the shutoff control circuit 12 can change a value of the shutoff control signal (SHUTC) through the ON domain circuit 10 after activation of the constantly power-ON domain 100. Thus, when a value indicating that the shutoff is to be disabled has been inputted, the shutoff control circuit 12 outputs to the shutoff control circuit 11 the shutoff control signal (SHUTC) indicating that the shutoff is to be disabled, and when a value indicating that the shutoff is to be enabled has been inputted, the shutoff control circuit 12 outputs to the shutoff control circuit 11 the shutoff control signal (SHUTC) indicating that the shutoff is to be enabled.

Moreover, for example, when a reset signal indicating power-OFF has been inputted to the constantly power-ON domain 100, the shutoff control circuit 12 outputs to the emergent shutoff control circuit 22 the shutoff control signal indicating that the shutoff is to be enabled. When the reset signal indicating power-ON has been inputted by the constantly power-ON domain 100, the shutoff control circuit 12 outputs to the shutoff control circuit 11 the shutoff control signal (SHUTC) indicating that the shutoff is to be disabled.

The second power source 201 is a circuit performing control to always keep a supplied voltage constant, for example, a regulator. The second power source 201 is connected to the AC outlet 1001 and supplies a power to the standby-time power-OFF domain 200 independently from the first power source 101. Moreover, the second power source 201 is connected with a capacitor 203. The capacitor 203 plays a role in supplying a power to the standby-time power-OFF domain 200 for a certain period of time in place of the second power source 201, for example, in a case where the power supply of the second power source 201 has stopped instantaneously.

The standby-time power-OFF domain 200 corresponds to a power-OFF domain according to the invention, is a region including a circuit whose power is turned off when necessary, for example, at time of standby, and is formed on the chip of the semiconductor integrated circuit 1000. Moreover, the standby-time power-OFF domain 200 is composed of an OFF domain circuit 20 and an emergent shutoff control circuit unit 23 including an emergent shutoff control circuit 21 and an emergent shutoff control circuit 22.

The OFF domain circuit 20 is a circuit realizing main functions (for example, reading and writing of an external nonvolatile memory) of the standby-time power-OFF domain 200 for a device loaded with the semiconductor integrated circuit 1000.

The emergent shutoff control circuit 21 performs emergent shutoff of a signal between the constantly power-ON domain 100 and the standby-time power-OFF domain 200 in accordance with a control signal from the emergent shutoff control circuit 22.

More specifically, when the emergent shutoff control circuit 21 has received from the emergent shutoff control circuit 22 an emergent shutoff control signal (ESHUTC) indicating that the emergent shutoff is to be disabled, the emergent shutoff control circuit 21 can receive a signal transmitted from the constantly power-ON domain 100 to the standby-time power-OFF domain 200 and output the received signal to the OFF domain circuit 20. Moreover, at this point, the emergent shutoff control circuit 21 can receive from the OFF domain circuit 20 a signal transmitted from the OFF domain circuit 20 to the constantly power-ON domain 100 and output the received signal to the ON domain circuit 10.

On the contrary, the emergent shutoff control circuit 21 corresponds to a signal shutoff circuit according to the invention, and when it has received from the emergent shutoff control circuit 22 an emergent shutoff control signal (ESHUTC) indicating that the emergent shutoff is to be enabled, shuts off signal inputting from the OFF domain circuit 20 and the shutoff control circuit 11 and at the same time, shuts off signal outputting to the OFF domain circuit 20 and the shutoff control circuit 11.

The emergent shutoff control circuit 22 corresponds to a holding circuit according to the invention, and outputs the emergent shutoff control signal (ESHUTC) to the emergent shutoff control circuit 21. Then the emergent shutoff control circuit 22 can output the emergent shutoff control signal (ESHUTC) to the emergent shutoff control circuit 21 to thereby prohibit or permit signal inputting and outputting by the emergent shutoff control circuit 21.

More specifically, the emergent shutoff control circuit 22, upon outputting to the emergent shutoff control circuit 21 the emergent shutoff control signal (ESHUTC) indicating that the emergent shutoff is to be enabled, makes the emergent shutoff control circuit 21 shut off the signal between the constantly power-ON domain 100 and the standby-time power-OFF domain 200. On the contrary, the emergent shutoff control circuit 22, upon outputting to the emergent shutoff control circuit 21 the emergent shutoff control signal (ESHUTC) indicating that emergent shutoff is to be disabled, makes the emergent shutoff control circuit 21 release the shutoff of the signal between the constantly power-ON domain 100 and the standby-time power-OFF domain 200.

For example, when the shutoff control signal (SHUTC) indicating that the shutoff is to be enabled has been inputted by the shutoff control circuit 12, the emergent shutoff control circuit 22 outputs to the emergent shutoff control circuit 21 the emergent shutoff control signal (ESHUTC) indicating that the emergent shutoff is to be enabled. Moreover, for example, when a reset signal has been inputted from the constantly power-ON domain 100 to the standby-time power-OFF domain 200 and the shutoff control signal (SHUTC) indicating that the shutoff is to be disabled has been inputted by the shutoff control circuit 12, the emergent shutoff control circuit 22 outputs to the emergent shutoff control circuit 21 the emergent shutoff control signal (ESHUTC) indicating that emergent shutoff is to be disabled.

As described above, the semiconductor integrated circuit 1000 is formed.

Figure 2:
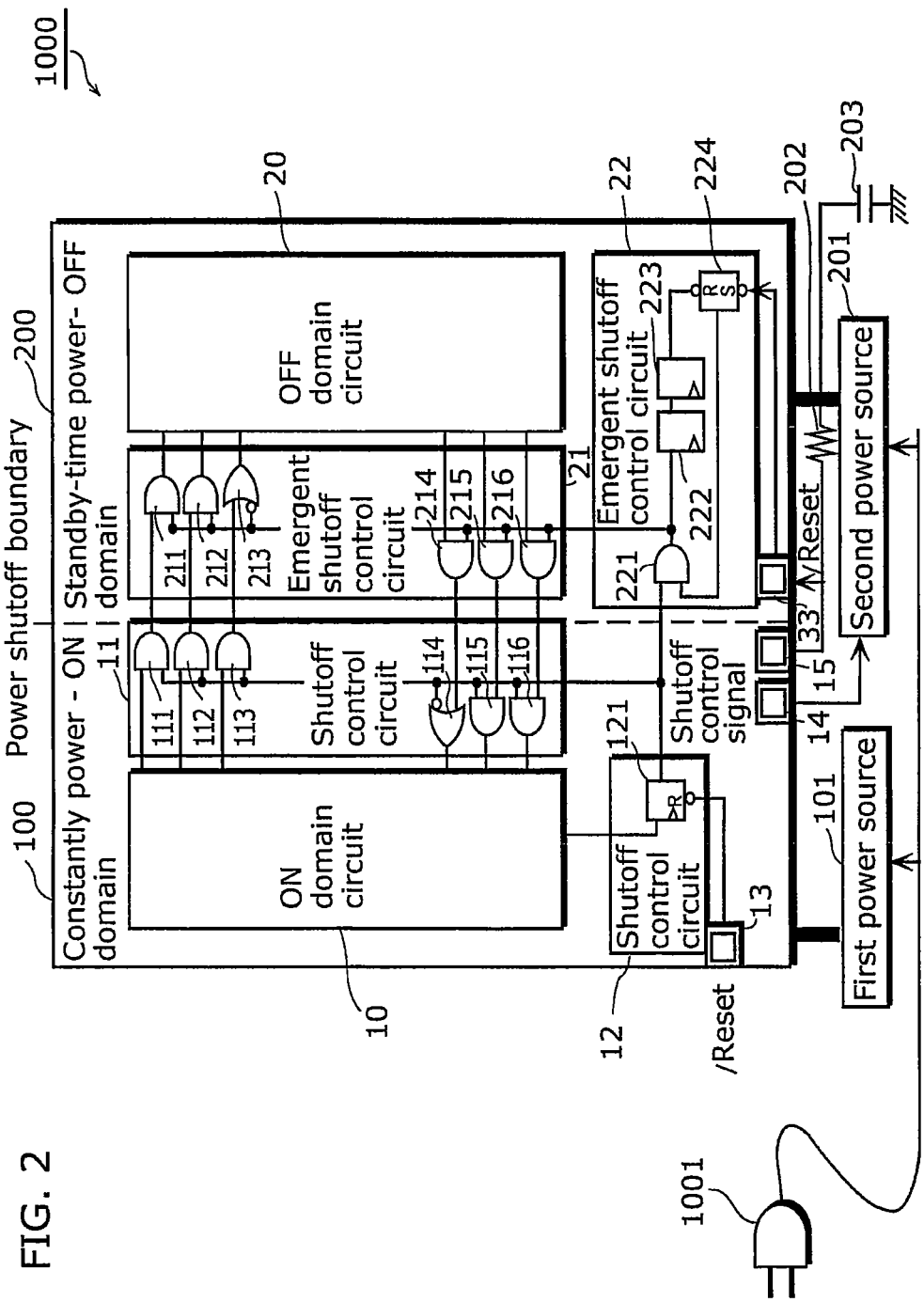
FIG. 2 is a block diagram showing configuration of the semiconductor integrated circuit according to the invention.

FIG. 2 is a block diagram showing circuit configuration of the semiconductor integrated circuit according to the invention. Illustrated in FIG. 2 is an example of circuits forming the semiconductor integrated circuit 1000 shown in FIG. 1. Moreover, components same as those in FIG. 1 are provided with the same numerals and their detailed description will be omitted.

In the semiconductor integrated circuit 1000, the standby-time power-OFF domain 200 includes a reset 33, and the constantly power-ON domain 100 includes: a reset 13, a push-pull output terminal 14, and an open drain output terminal 15. Moreover, the semiconductor integrated circuit 1000 includes a resistor 202 as a pull-up circuit in which the reset 33 inputs a high-level signal to the emergent shutoff control circuit 22 (RS flip-flop 224) when the open drain output terminal 15 outputs high impedance (Hiz).

The reset 13 detects that the reset signal indicating power-OFF has been inputted to the constantly power-ON domain 100 or detects that the power supply to the constantly power-ON domain 100 has stopped and outputs a low-level signal as reset input to the shutoff control circuit 12.

The push-pull output terminal 14, in accordance with a control signal of the ON domain circuit 10, outputs a second power source 201 control signal (REGUC) to the second power source 201 to thereby turn on or off the power of the second power source 201.

The open drain output terminal 15, in accordance with the control signal of the ON domain circuit 10, outputs a reset signal of the standby-time power-OFF domain 200 to the reset 33. The reset 33 outputs this low-level signal to the emergent shutoff control circuit 22.

The shutoff control circuit 11 includes: a first output circuit composed of an AND circuit 111, an AND circuit 112, and an AND circuit 113; and a first input circuit composed of an OR circuit 114, an AND circuit 115, and an AND circuit 116.

In the shutoff control circuit 11, when a high-level signal as the shutoff control signal (SHUTC) indicating that the shutoff is to be disabled has been received from the shutoff control circuit 12 to input terminals of the first input circuit and the first output circuit, a signal outputted from the ON domain circuit 10 is inputted to the emergent shutoff control circuit 21 (second input circuit) via the first output circuit. Moreover, at this point, in the shutoff control circuit 11, a signal outputted from the OFF domain circuit 20 is inputted to the first input circuit via a second output circuit.

The shutoff control circuit 12 is formed of a flip-flop 121. In the shutoff control circuit 12, when a low-level signal has been inputted as reset input to the reset 13, the flip-flop 121 outputs to the shutoff control circuit 11 and the emergent shutoff control circuit 22 the low-level signal as the shutoff control signal (SHUTC) indicating that the shutoff is to be enabled. Moreover, when operation of disabling the shutoff has been performed or the reset signal indicating power-ON has not been inputted to the reset 13, the flip-flop 121 outputs to the shutoff control circuit 11 and the emergent shutoff control circuit 22 a high-level signal as the shutoff control signal indicating that the shutoff is to be disabled.

The emergent shutoff control circuit 21 includes: the second input circuit composed of an AND circuit 211, an AND circuit 212, and an OR circuit 213; and the second output circuit composed of an AND circuit 214, an AND circuit 215, and an AND circuit 216.

In the emergent shutoff control circuit 21, when a high-level signal as the emergent shutoff control signal (ESHUTC) indicating that the emergent shutoff is to be disabled has been received from the emergent shutoff control circuit 22 to input terminals of the second input circuit and the second output circuit, the signal outputted from the ON domain circuit 10 is inputted to an OFF domain input circuit via an ON domain output circuit. Moreover, at this point, in the emergent shutoff control circuit 21, the signal outputted from the OFF domain circuit 20 is inputted to an input circuit of the emergent shutoff control circuit 21 via the ON domain output circuit.

The emergent shutoff control circuit 22 is composed of an AND circuit 221, latch circuits 222 and 223, and the RS flip-flop 224. In the emergent shutoff control circuit 22, when a low-level signal as the shutoff control signal (SHUTC) indicating that the shutoff is to be enabled has been received from the shutoff control circuit 12, the AND circuit 221 outputs to an input terminal side of the second input circuit and the second output circuit of the emergent shutoff control circuit 21 a low-level signal as the emergent shutoff control signal indicating that the emergent shutoff is to be enabled.

In the latch circuits 222 and 223, a signal outputted from the AND circuit 221 is latched in two steps to thereby absorb fluctuation of the signal outputted from the AND circuit 221. Moreover, the RS flip-flop 224 holds a signal when a high-level signal or a low-level signal has been received for the AND circuit 221, and outputs the high-level signal or the low-level signal to the AND circuit 221.

For example, when the low-level signal has been received for the AND circuit 221, the RS flip-flop 224 outputs the low-level signal to the AND circuit 221. Consequently, the AND circuit 221 can output to the input terminal side of the second input circuit and the second output circuit of the emergent shutoff control circuit 21 the low-level signal as the emergent shutoff control signal (ESHUTC) indicating that the emergent shutoff is to be enabled.

Moreover, the RS flip-flop 224, as a result of receiving the low-level signal from the reset 33, releases the outputting of the low-level signal as the emergent shutoff control signal (ESHUTC) indicating that the emergent shutoff is to be enabled. Thus, the RS flip-flop 224, as a result of receiving the low-level signal from the reset 33, releases the outputting of the low-level signal and further outputs the low-level signal to the AND circuit 221 until the AND circuit 221 receives a high-level signal from the shutoff control circuit 12.

Therefore, until newly receiving from the shutoff control circuit 12 the high-level signal as the shutoff control signal (SHUTC) indicating that the shutoff is to be disabled, the AND circuit 221 can output to the input terminal side of the second input circuit and the second output circuit a low-level signal as the emergent shutoff control signal (ESHUTC) indicating that the emergent shutoff is to be enabled.

As described above, the circuits of the semiconductor integrated circuit 1000 are formed.

As described above, in the semiconductor integrated circuit 1000, not only the constantly power-ON domain 100 includes the shutoff control circuit 11 and the shutoff control circuit 12, but also the standby-time power-OFF domain 200 includes the emergent shutoff control circuit 21 and the emergent shutoff control circuit 22. For example, an unanticipated state arises in which the AC outlet 1001 has come out, no power is supplied to the constantly power-ON domain 100, and the power of the constantly power-ON domain 100 first turns off. Even in this case, in the semiconductor integrated circuit 1000, the emergent shutoff control circuits 21 and 22 can function to shut off inputting of an unstable signal from the constantly power-ON domain 100 and inputting of through current to the constantly power-ON domain 100. This consequently can realize a semiconductor integrated circuit that prevents adverse effect from being exerted on a power-OFF circuit region even when the power of the constantly power-ON circuit region has been first shut off.

Next, operation of the semiconductor integrated circuit 1000 formed as described above will be described.

Figure 3:
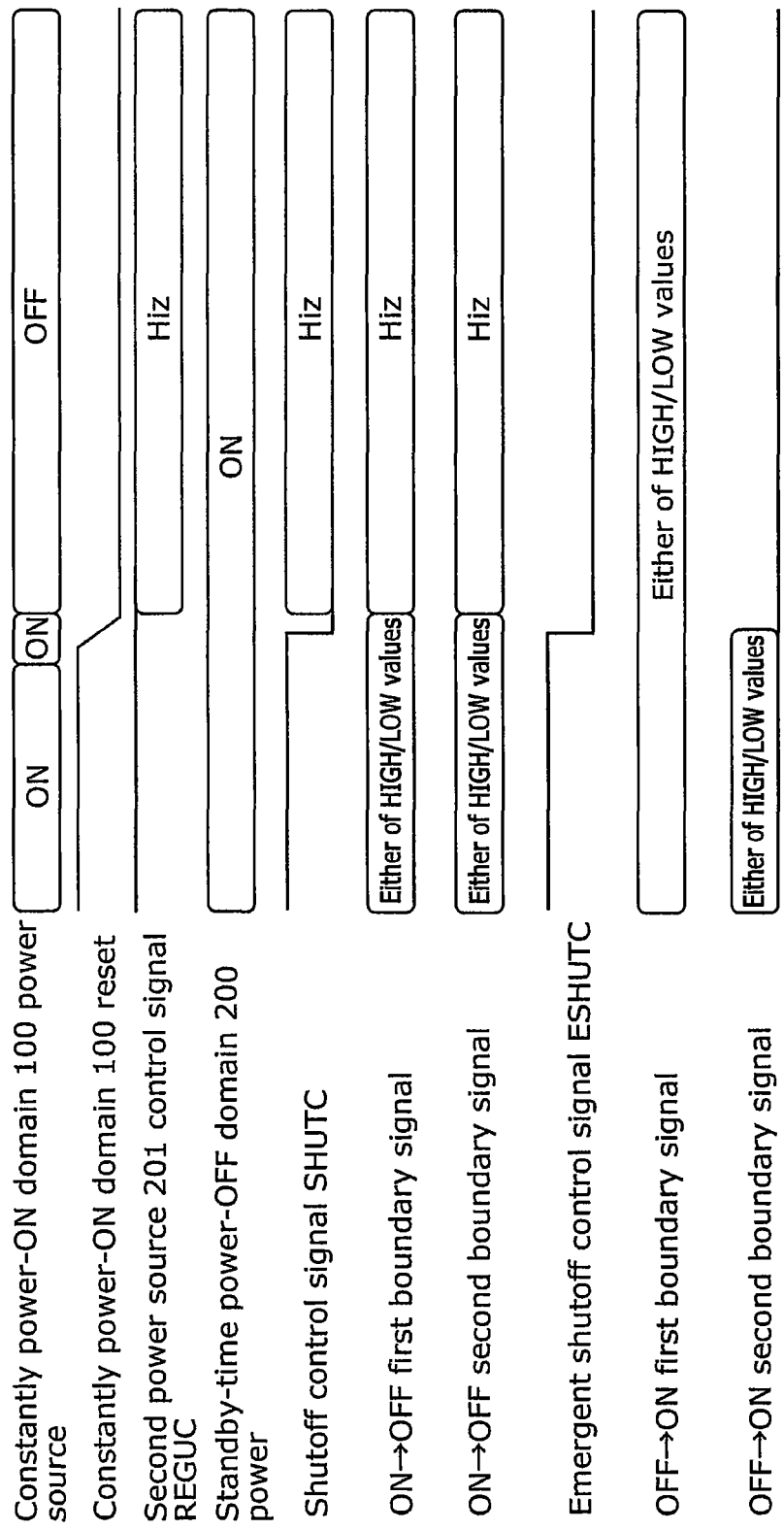
FIG. 3 is a timing diagram illustrating operation of the semiconductor integrated circuit at time of emergent shutoff control according to the invention.

FIG. 3 is a timing diagram illustrating operation of the semiconductor integrated circuit at time of emergent shutoff control according to the invention. Described referring to FIG. 3 below is operation performed, for example, in the case where the AC outlet 1001 has come out, no power has been supplied to the constantly power-ON domain 100, and the power of the constantly power-ON domain 100 has been first turned off.

First, assume that a power is being properly supplied to the semiconductor integrated circuit 1000. That is, the powers are supplied to the constantly power-ON domain 100 and the standby-time power-OFF domain 200 from the first power source 101 and the second power source 201, respectively.

At this point, to the constantly power-ON domain 100, the reset signal indicating power-OFF is not inputted and thus constantly power-ON domain 100 reset indicates a high level.

Moreover, the constantly power-ON domain 100 does not perform control of turning off the power of the standby-time power-OFF domain 200. Thus, the second power source 201 control signal (REGUC) indicates a high level. More specifically, the push-pull output terminal 14, in accordance with the control signal of the ON domain circuit 10, puts the second power source 201 control signal (REGUC) at the high level in order to indicate that the power of the second power source 201 is kept ON and outputs it to the second power source 201.

Moreover, the reset signal indicating power-OFF has not been inputted to the constantly power-ON domain 100, and therefore the shutoff control circuit 12 turns the shutoff control signal (SHUTC) into a high level in order to indicate that the shutoff is to be disabled and outputs it to the shutoff control circuit 11 and the emergent shutoff control circuit 21. That is, the shutoff control signal (SHUTC) indicates the high level.

Moreover, an ON→OFF first boundary signal indicating a level of a signal inputted to the first output circuit and an ON→OFF second boundary signal indicating a signal outputted from the first output circuit indicate a high level or a low level.

This is because of a state in which in the shutoff control circuit 12, the high-level shutoff control signal (SHUTC) indicating that the shutoff is to be disabled has been inputted from the shutoff control circuit 11 and the signal (either high or low) outputted from the ON domain circuit 10 has been inputted to the first output circuit of the shutoff control circuit 12 and outputted from the first output circuit.

Moreover, the emergent shutoff control signal (ESHUTC) indicates a high level. This is because the power of the standby-time power-OFF domain 200 is ON and the standby-time power-OFF domain 200 is at normal work and thus the emergent shutoff control circuit 22 outputs to the emergent shutoff control circuit 21 the high-level emergent shutoff control signal (ESHUTC) indicating that the emergent shutoff is to be disabled.

Moreover, an OFF→ON first boundary signal indicating a level of a signal inputted to the second output circuit and the ON→OFF second boundary signal indicating a signal outputted from the second output circuit indicate a high level or a low level. This is because the standby-time power-OFF domain 200 is at normal work and thus the high-level emergent shutoff control signal (ESHUTC) indicating that the emergent shutoff is to be disabled is inputted from the emergent shutoff control circuit 21 to the emergent shutoff control circuit 22. Thus, the signal (high or low) outputted from the OFF domain circuit 20 is inputted to the second output circuit of the emergent shutoff control circuit 22 and outputted from the second output circuit.

Next, assume that the AC outlet 1001 has come out and under the influence of, for example, the capacitor 203 connected to the second power source 201, the power of the constantly power-ON domain 100 has turned off earlier than the power of the standby-time power-OFF domain 200.

At this point, a reset signal has been inputted to the constantly power-ON domain 100 and thus the constantly power-ON domain 100 reset is set at a low level. This indicates that the reset 13 detects that the power supply to the constantly power-ON domain 100 has stopped and outputs a low-level power-OFF reset signal to the shutoff control circuit 12.

Then the emergent shutoff control signal (ESHUTC) turns from the high level to a low level. More specifically, in the shutoff control circuit 12, the power-OFF reset signal inverted into a low level is received at the flip-flop 121 and the low-level shutoff control signal (SHUTC) indicating that the shutoff is to be enabled is outputted from the flip-flop 121 to the shutoff control circuit 11 and the emergent shutoff control circuit 22. Then the emergent shutoff control circuit 22 receives the low-level shutoff control signal (SHUTC) from the shutoff control circuit 12, and outputs to the emergent shutoff control circuit 21 the low-level emergent shutoff control signal (ESHUTC) indicating that the emergent shutoff is to be enabled.

The ON→OFF second boundary signal outputted from the second output circuit turns into a low level. This is because the power of the constantly power-ON domain 100 has turned off and thus the emergent shutoff control circuit 21 receives from the emergent shutoff control circuit 22 the low-level emergent shutoff control signal (ESHUTC) indicating that the emergent shutoff is to be enabled and shuts off the signal from the second output circuit. Then this emergent shutoff control can prevent abnormal voltage addition to a gate of an MOSFET of the constantly power-ON domain 100.

Next, assume that the power of the constantly power-ON domain 100 has completely turned off earlier than the power of the standby-time power-OFF domain 200.

The second power source 201 control signal (REGUC), the shutoff control signal (SHUTC), the ON→OFF first boundary signal, and the ON→OFF second boundary signal turn into a high-impedance (Hiz) state, as shown in FIG. 3. This indicates that since the power of the constantly power-ON domain 100 has turned off earlier than the power of the standby-time power-OFF domain 200, the signals indicating the high impedance (Hiz) (neither high nor low) are outputted from the push-pull output terminal 14, the shutoff control circuit 12, and the first output circuit which are no longer controllable.

The shutoff control signal (SHUTC), after indicating a low level, turns into the high-impedance (Hiz) state. This indicates a state in which the power of the constantly power-ON domain 100 has turned off, an uncontrollable state has occurred due to no power supply, and high impedance (Hiz) has been outputted.

As described above, in the semiconductor integrated circuit 1000 in this embodiment, even in a case of occurrence of an unanticipated state, for example, a state where the first power source 101 has comes out and the power of the constantly power-ON domain 100 has first turned off, the emergent shutoff control circuit 21 and the emergent shutoff control circuit 22 can function to perform the emergent shutoff control. This consequently can shut off the inputting of the unstable signal from the constantly power-ON domain 100 and the inputting of the through current to the constantly power-ON domain 100.

Here, for comparison with the operation of the semiconductor integrated circuit 1000 in this embodiment, operation of a conventional semiconductor integrated circuit is to be described.

Figure 4:
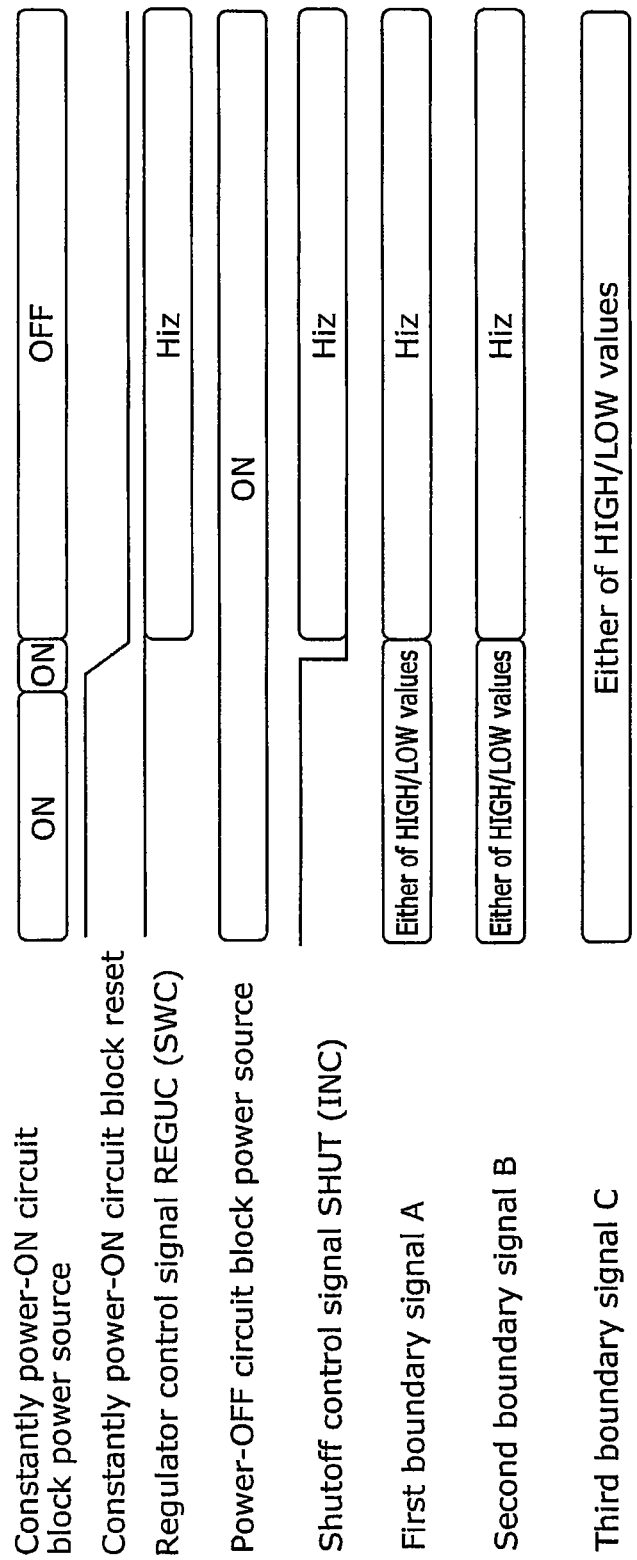
FIG. 4 is a timing diagram illustrating operation of a conventional semiconductor integrated circuit.

FIG. 4 is a timing diagram illustrating operation of the conventional semiconductor integrated circuit at time of emergent shutoff control.

In the conventional semiconductor integrated circuit, at least the emergent shutoff control circuit 21 and the emergent shutoff control circuit 22 are not included. Thus, in a case where a power of a constantly power-ON domain circuit block corresponding to the constantly power-ON domain 100 has turned off earlier than a power of a power-OFF circuit block corresponding to the standby-time power-OFF domain 200, not only an unstable signal (Hiz) from circuits forming the constantly power-ON circuit block cannot be shut off but also abnormal voltage addition to a gate of a MOSFET of the constantly power-ON circuit block cannot be prevented.

In FIG. 4, a first boundary signal A indicates a signal inputted to a shutoff circuit from the constantly power-ON circuit block included in the conventional semiconductor integrated circuit. A second boundary signal B indicates a signal outputted from the shutoff circuit to the power-OFF circuit block. A third boundary signal C indicates a signal inputted from the power-OFF circuit block to the constantly power-ON circuit block.

Figure 5:
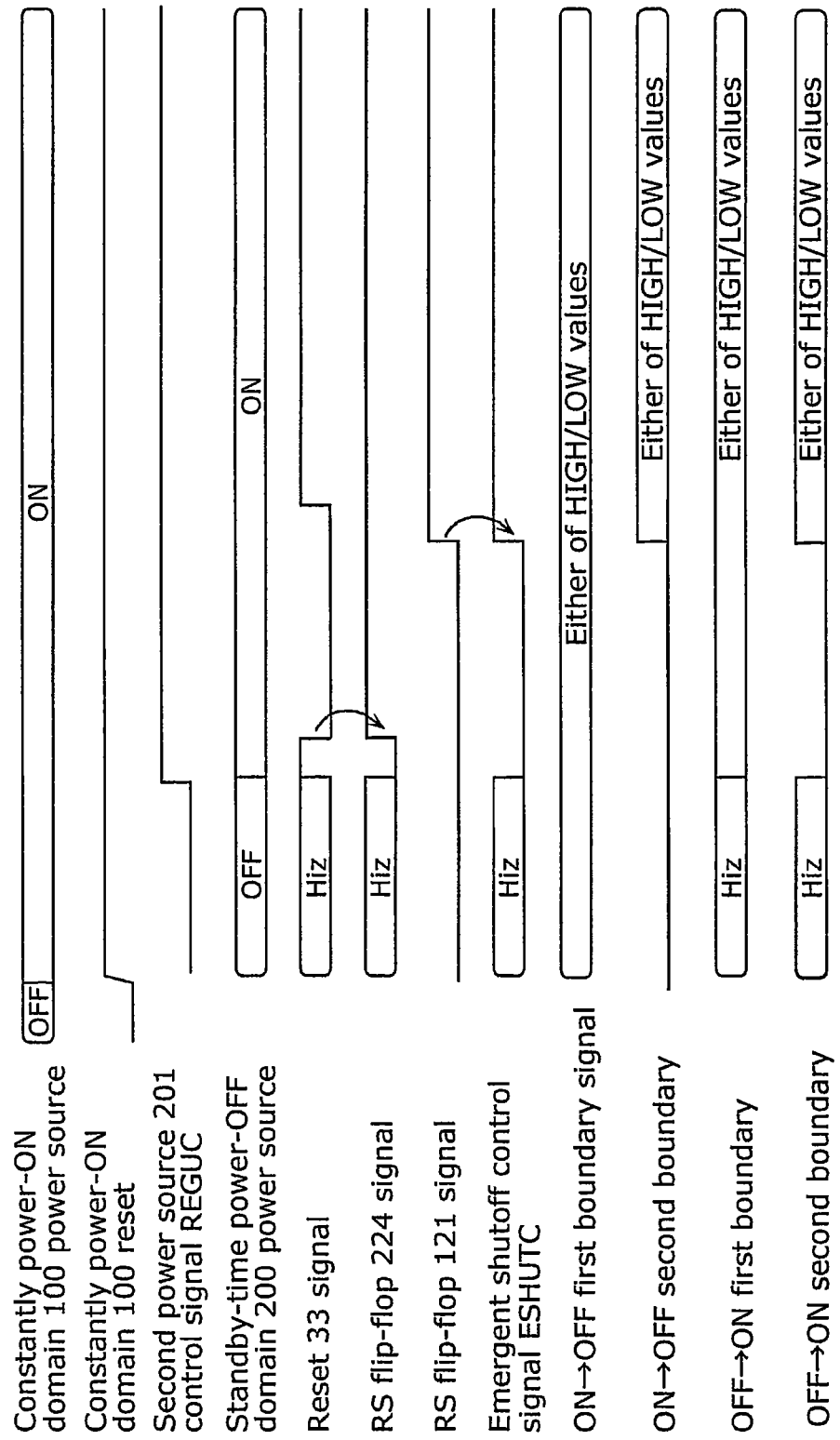
FIG. 5 is a timing diagram illustrating operation of the semiconductor integrated circuit at time of releasing the emergent shutoff control according to the invention.

FIG. 5 is a timing diagram illustrating operation of the semiconductor integrated circuit at time of releasing the emergent shutoff control according to the invention.

Illustrated in FIG. 5 is the operation performed in a case where the emergent shutoff control described above is performed and after the power of the semiconductor integrated circuit 1000 completely turns off, the constantly power-ON domain 100 and the standby-time power-OFF domain 200 are activated again.

First, after the emergent shutoff control is performed, no power is supplied to the semiconductor integrated circuit 1000. That is, no power is supplied to the constantly power-ON domain 100 and the standby-time power-OFF domain 200, and they are both in a power-OFF state.

At this point, the constantly power-ON domain 100 reset indicates a low level. This is because the power of the shutoff control circuit 11 has turned off after the emergent shutoff control described above is performed, indicating a state in which a power-ON reset signal has not been inputted.

Next, the power of the constantly power-ON domain 100 is turned on earlier than the power of the standby-time power-OFF domain 200. That is, the first power source 101 is made start the power supply to the constantly power-ON domain 100.

At this point, for the constantly power-ON domain 100 reset, a low-level power-ON reset signal indicating that the power supply by the first power source 101 has been stabilized is inputted.

Moreover, at this point, the standby-time power-OFF domain 200 turns into a power-OFF state in which no power is supplied by the second power source 201. Therefore, the second power source 201 control signal (REGUC) indicates a low level, and a reset 33 signal, a RS flip-flop 224 signal, the emergent shutoff control signal (ESHUTC), the OFF→ON first boundary signal, and an OFF→ON second boundary signal indicate high impedance (Hiz).

Moreover, the flip-flop 121 is a low-level signal indicating that the shutoff is to be enabled. That is, the shutoff control circuit 12 outputs to the shutoff control circuit 12 and the emergent shutoff control circuit 21 the low-level shutoff control signal (SHUTC) indicating that the shutoff is to be enabled.

Moreover, the ON→OFF first boundary signal indicating the signal inputted to the first output circuit indicates a high level or a low level. This is because the constantly power-ON domain 100 is activated and a signal from the ON domain circuit 10 can be received.

However, the flip-flop 121 is a low-level signal indicating that the shutoff is to be enabled. That is, the shutoff control circuit 12 outputs to the shutoff control circuit 12 and the emergent shutoff control circuit 21 the low-level shutoff control signal (SHUTC) indicating that the shutoff is to be enabled.

Therefore, the shutoff control circuit 11 cannot output the signal from the ON domain circuit 10 to the emergent shutoff control circuit 21, and thus the ON→OFF second boundary signal indicating the signal outputted from the first output circuit indicates a low level.

Next, the power of the standby-time power-OFF domain 200 is turned on. That is, the push-pull output terminal 14, in accordance with the control signal of the ON domain circuit 10, outputs the high-level second power source 201 control signal (REGUC) to the second power source 201 and causes supply of the power of the second power source 201 to the standby-time power-OFF domain 200.

Then after the power of the standby-time power-OFF domain 200 is turned on, the shutoff of the shutoff control circuit 12 and the emergent shutoff control circuit 22 is released, which will be described in detail below.

First, from the open drain output terminal 15, a low level is outputted. Then the reset 33 outputs the low-level signal to the RS flip-flop 224.

Next, the RS flip-flop 224 receives the low-level reset signal from the reset 33, and releases the held low-level signal indicating that the shutoff is to be enabled. That is, a signal pulled up to a high level by the resistor 202 is turned into a low level by the open drain output terminal 15, whereby the RS flip-flop 224 receives the low-level signal and releases the held low-level signal.

Moreover, the flip-flop 121, independently from operation of releasing the holding of the RS flip-flop 224, performs operation of disabling the shutoff. That is, switching of the flip-flop 121 is made from the low-level shutoff control signal (SHUTC) indicating that the shutoff is to be enabled to the high level shutoff control signal (SHUTC) indicating that shutoff is to be disabled. As a result, the shutoff control circuit 12 outputs to the shutoff control circuit 11 and emergent shutoff control circuit 22 the high-level shutoff control signal (SHUTC) indicating that the shutoff is to be disabled.

As described above, when the power has been introduced again to the constantly power-ON domain 100, reset is inputted to the standby-time power-OFF domain 200 to release the emergent shutoff control during the reset inputting.

The reset of the standby-time power-OFF domain 200 can be controlled from the ON domain circuit 10.

As described above, the invention can realize a semiconductor integrated circuit that prevents adverse effect from being exerted on the power-OFF circuit region even when the power of the constantly power-ON circuit region has been first turned off.

For example, even in an emergent case where the unanticipated state occurs in which the AC outlet 1001 has come out and the power of the constantly power-ON domain 100 has first turned off, the shutoff control circuit 12 detects the power-OFF of the constantly power-ON domain and performs resetting, thereby setting the shutoff control signal at a low level. Then the emergent shutoff control circuit 22, in response to the shutoff control signal, outputs to the emergent shutoff control circuit 21 the emergent shutoff control signal set at a low level, thereby preventing the inputting of the unstable signal from the constantly power-ON domain 100 and the abnormal voltage inputting to the gate of the MOSFET of the constantly power-ON domain 100.

Moreover, with the invention, upon negation of the reset of the standby-time power OFF domain, when the shutoff control signal is set at a low level, a shutoff state of the standby-time power-OFF domain is latched at the emergent shutoff control circuit 22.

Note that the latched state may be released through external resetting other than the release described above.

The semiconductor integrated circuit of the invention has been described above based on the embodiment, but the invention is not limited to this embodiment. Within a scope not departing from the spirits of the invention, various modifications thought by those skilled in the art and a mode combining together the components of this embodiment are also included in the scope of the invention.

Although only an exemplary embodiment of the present invention has been described in detail above, the present invention should not be limited to the exemplary embodiment. A modification that those skilled in the art will readily appreciate or a modification to the exemplary embodiment should be included within the scope of the present invention without materially departing from the novel teachings and advantages of the present invention.

INDUSTRIAL APPLICABILITY

Figure 6:
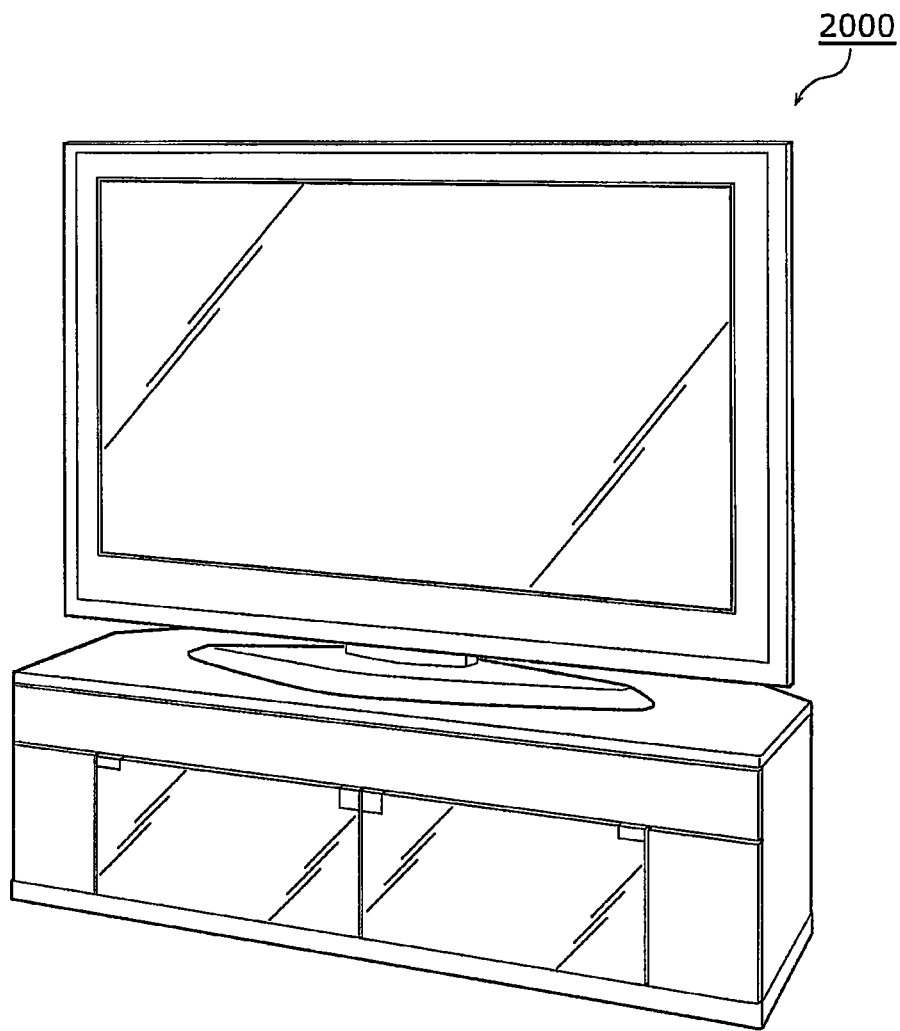
FIG. 6 is a diagram showing an example of a device including the semiconductor integrated circuit according to the invention.
Figure 7A:
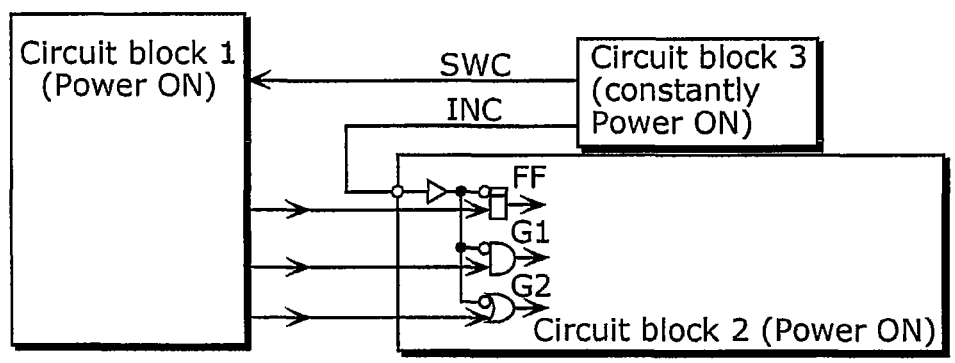
FIG. 7A is a diagram illustrating a conventional semiconductor integrated circuit.
Figure 7B:
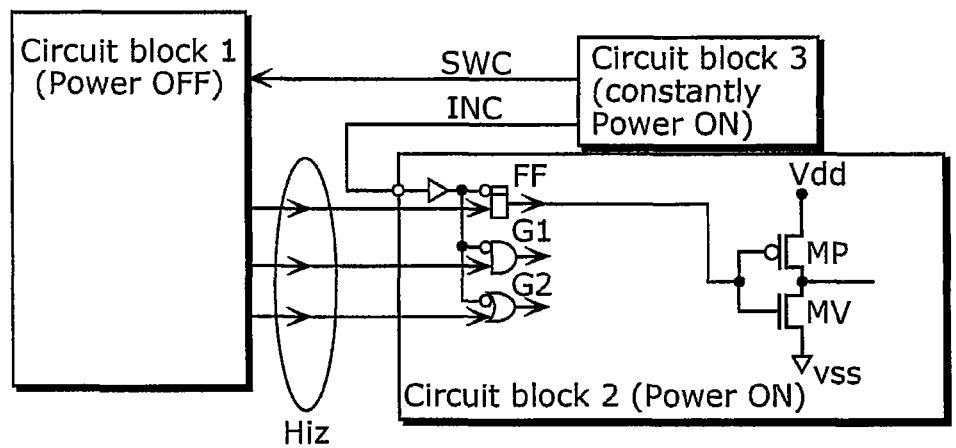
FIG. 7B is a diagram illustrating a conventional semiconductor integrated circuit.

The present invention can be applied to semiconductor integrated circuits, and can be applied to semiconductor integrated circuits loaded in, for example, a television 2000 shown in FIG. 6.

What is claimed is:

1. A semiconductor device comprising:
a first circuit configured to receive power from a first power source, the first circuit including a shutoff control circuit configured to output a first control signal after power supply from the first power source is stopped, and
a second circuit configured to receive power from a second power source, the second circuit coupled with the first circuit for at least transmitting a first transmission signal to the first circuit, the second circuit including a first signal shutoff circuit configured to shut off the first transmission signal in accordance with the first control signal, wherein
the first circuit is configured to control the second power source.

2. A semiconductor device comprising:
a first circuit configured to receive power from a first power source, the first circuit including a shutoff control circuit configured to output a first control signal after power supply from the first power source is stopped, and
a second circuit configured to receive power from a second power source, the second circuit coupled with the first circuit for at least transmitting a first transmission signal to the first circuit, the second circuit including a first signal shutoff circuit configured to shut off the first transmission signal in accordance with the first control signal, wherein the first signal shutoff circuit includes:
a holding circuit configured to, after the power supply from the first power source is stopped, hold output a second control signal in accordance with the first control signal and hold the second control signal; and
a shutoff circuit configured to shut off the first transmission signal in accordance with the second control signal, and
the holding circuit includes an AND circuit, a latch circuit, and an RS flip-flop.

3. The semiconductor device according to claim 2, wherein
the AND circuit is configured to receive the first control signal from the shutoff control circuit and a first binary signal from the RS flip-flop and output the second control signal to the latch circuit and the shutoff circuit,
the latch circuit is configured to receive the second control signal and output a second binary signal to the RS flip-flop, and
the RS flip-flop is configured to receive the second binary signal and output the first binary signal to the AND circuit.

4. A semiconductor device comprising:
a first circuit configured to receive power from a first power source, the first circuit including a shutoff control circuit configured to output a first control signal after power supply from the first power source is stopped, and
a second circuit configured to receive power from a second power source, the second circuit coupled with the first circuit for at least transmitting a first transmission signal to the first circuit, the second circuit including a first signal shutoff circuit configured to shut off the first transmission signal in accordance with the first control signal, wherein
the shutoff control circuit includes a flip-flop.

* * * * *